United States Patent
Gauthier et al.

(10) Patent No.: US 6,671,863 B2
(45) Date of Patent: Dec. 30, 2003

(54) OPTIMIZATION OF LOOP BANDWIDTH FOR A PHASE LOCKED LOOP

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 51 days.

(21) Appl. No.: 10/075,339

(22) Filed: Feb. 14, 2002

(65) Prior Publication Data

US 2003/0154453 A1 Aug. 14, 2003

(51) Int. Cl.[7] .................................................. G06F 9/45
(52) U.S. Cl. ................. 716/6; 716/4; 716/6; 324/76.19
(58) Field of Search ........... 716/1–6, 18; 327/147–150, 327/156–157; 331/14, 25, 16; 375/373–376; 324/76.82, 76.19, 751, 509, 76.74, 76.53

(56) References Cited

U.S. PATENT DOCUMENTS

| | | | | |
|---|---|---|---|---|
| 6,057,739 A | * | 5/2000 | Crowley et al. | 331/14 |
| 6,316,987 B1 | * | 11/2001 | Dally et al. | 327/538 |
| 6,434,206 B1 | * | 8/2002 | Yu | 375/376 |
| 6,483,358 B2 | * | 11/2002 | Ingino, Jr. | 327/157 |
| 6,538,499 B1 | * | 3/2003 | Lu | 327/557 |

* cited by examiner

Primary Examiner—Vuthe Siek
Assistant Examiner—Binh Tat
(74) Attorney, Agent, or Firm—Rosenthal & Osha L.L.P.

(57) ABSTRACT

A method for optimizing loop bandwidth in a phase locked loop is provided. A representative power supply waveform having noise is input into a simulation of the phase locked loop; an estimate of jitter is determined; and the loop bandwidth of the phase looked loop is adjusted until the jitter falls below a pre-selected value. Further, a computer system for optimizing loop bandwidth in a phase locked loop is provided. Further, a computer-readable medium having recorded thereon instructions adapted to optimize loop bandwidth in a phase locked loop is provided.

36 Claims, 9 Drawing Sheets

OPTIMIZATION OF LOOP BANDWIDTH FOR A PHASE LOCKED LOOP

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as sys_clk) to various parts of the computer system (10). Modem microprocessors and other integrated circuits, however, are typically capable of operating at frequencies significantly higher than the system clock, and thus, it becomes important to ensure that operations involving the microprocessor (12) and the other components of the computer system (10) use a proper and accurate reference of time.

One component used within the computer system (10) to ensure a proper reference of time among a system clock and a microprocessor clock, i.e., "chip clock," is a type of clock generator known as a phase locked loop, or "PLL" (20). The PLL (20) is an electronic circuit that controls an oscillator such that the oscillator maintains a constant phase relative to a system signal. Referring to FIG. 1, the PLL (20) has as its input the system clock, which is its reference signal, and outputs a chip clock signal (shown in FIG. 1 as chip_clk) to the microprocessor (12). The system clock and chip clock have a specific phase and frequency relationship controlled by the PLL (20). This relationship between the phases and frequencies of the system clock and chip clock ensures that the various components within the microprocessor (12) use a controlled and accounted for reference of time. When this relationship is not maintained by the PLL (20), however, the operations within the computer system (10) become non-deterministic.

FIG. 2 shows a PLL (20). The PLL (20) comprises a feedback loop that aligns the transition edge and frequency of the system clock (41) and a feedback loop signal (40). The PLL adjusts the output frequency in order to zero any phase and frequency difference between the system clock (41) and the feedback loop signal (40). The addition of a divide by N circuit (39) in the feedback loop enables the PLL to generate an output that has a frequency of N times the system clock (41) frequency. Multiplying the system clock is useful when the chip clock (42) must have a higher frequency than the system clock (41). The PLL core (36) adjusts the output frequency in order to zero any phase and frequency difference between the system clock (41) and the feedback loop signal (40). By adding the divide by N block (39), the chip clock (42) must be N times faster to allow the phase and frequency difference between the system clock (41) and the feedback loop signal (40) to zero. The PLL (20) may also have buffers (37, 38) to drive a larger resistive and/or capacitive load. The buffers (37, 38) are in the feedback loop so that any phase shift created by the buffers (37, 38) is zeroed by the PLL core (36).

One common performance measure for a PLL is jitter. Jitter is the time domain error from poor spectral purity of an output. In other words, in a repeated output pattern, such as a clock signal, a transition that occurs from one state to another does not happen at the same time relative to other transitions. The input clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise. For a circuit designer to appropriately design a PLL, a good understanding of the behavior of the system is required.

FIG. 3 shows a section of a typical power supply network (100) of a computer system. The power supply network (100) may be representative of a single integrated circuit, or "chip", or equally an entire computer system comprising multiple integrated circuits. The power supply network (100) has a power supply (112) that provides a power supply line (114) and a ground line (116) through an impedance network $Z_I$ (118). The impedance network is a collection of passive elements that result from inherent resistance, capacitance, and/or inductance of physical connections. A power supply line (122, 123) and a ground line (124, 125) supply a circuit A (120) and circuit B (126), respectively. Power supply line (123) and ground line (125) also supply circuit C (130) through another impedance network $Z_2$ (128) and additional impedance networks and circuits, such as impedance network $Z_n$ (132) and circuit N (134). The impedance network and connected circuits may be simulated so that the designer can better understand the behavior of how the circuits interact.

Still referring to FIG. 3, circuit A (120), circuit B (126), circuit C (130), and circuit N (134) may be analog or digital circuits. Also, circuit A (120), circuit B (126), circuit C (130), and circuit N (134) may generate and/or be susceptible to power supply noise. For example, circuit C (130) may generate a large amount of power supply noise that affects the operation of both circuit B (126) and circuit N (134). The designer, in optimizing the performance of circuit B (126) and circuit N (134), requires an understanding of the characteristics of the power supply noise. By understanding the characteristics of the power supply noise, the designer has a foundation on which to use a variety of design techniques that protect against effects from power supply noise, such as loop bandwidth.

SUMMARY OF INVENTION

One aspect of the present invention is a method for optimizing loop bandwidth in a phase locked loop. The method includes inputting a representative power supply waveform having noise to a simulation of the phase locked loop, estimating jitter of the phase locked loop, adjusting the loop bandwidth of the phase locked loop, and repeating the inputting, estimating, and adjusting until the jitter falls below a selected amount.

Another aspect of the present invention is a computer system for optimizing loop bandwidth in a phase locked loop. The computer system includes a processor, a memory, and software instructions stored in the memory adapted to cause the computer system to accept as input a representative power supply waveform having noise into a simulation of the phase locked loop, estimate jitter of the phase locked loop, adjust the loop bandwidth of the phase locked loop, and repeat the input, estimate, and adjust until the jitter falls below a selected amount.

Another aspect of the present invention is a computer-readable medium that has recorded instructions thereon executable by a processor. The instructions are adapted to cause a computer to accept as input a representative power supply waveform having noise into a simulation of a phase locked loop, estimate jitter of the phase locked loop, adjust the loop bandwidth of the phase locked loop, and repeat the input, estimate, and adjust until the jitter falls below a selected amount.

Other aspects and advantages of the invention will be apparent from the following description and the appended claims.

DETAILED DESCRIPTION

Embodiments of the present invention relate to a method for optimizing loop bandwidth in a phase locked loop.

Figure 3:
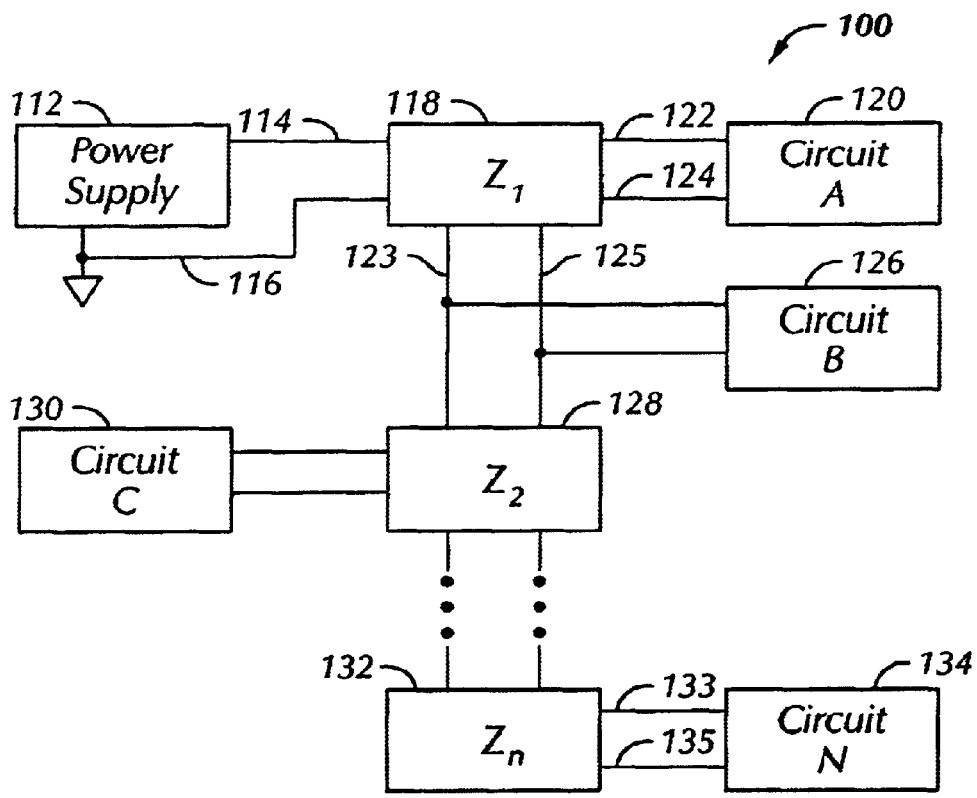
FIG. 3 shows a typical computer system power supply network.

In FIG. 3, the impedance networks (118, 128, 132) may be very complex arrangements of passive elements. The impedances may be the result of, but not limited to, a power supply connection, bulk capacitors, printed circuit board planes, printed circuit board vias, ceramic capacitors, printed circuit board to chip package connections, chip package planes, chip package vias, chip package capacitors, chip package to chip bump or bond wire connections, chip local and global decoupling capacitors, and switching and non-switching circuit elements. A "chip package" for the purpose of this description of the invention may be any package that allows mounting an integrated circuit to a printed circuit board. An integrated circuit, or die, is also referred to as a "chip" in this description. Also, each of the circuits (120, 126, 130, 134) in FIG. 3 may induce power supply noise on the impedance networks (118, 128, 132). The power supply noise characteristics can result from interactions between the circuits (120, 126, 130, 134) coupled with the impedance networks (118, 128, 132).

For a designer to adequately examine the behavior of the power supply noise, a simulation model is desirable. The simulation model is input into a simulation tool so that a computer can calculate the effects of one or more input excitations. One example of a simulation tool is SPICE, which is an acronym for Simulation Program with Integrated Circuit Emphasis. Modeling a complex array of impedances is difficult, however. Furthermore, even if an accurate simulation model is created, the computing overhead necessary to simulate one or more circuits with the impedance model network may be too great.

Figure 4:
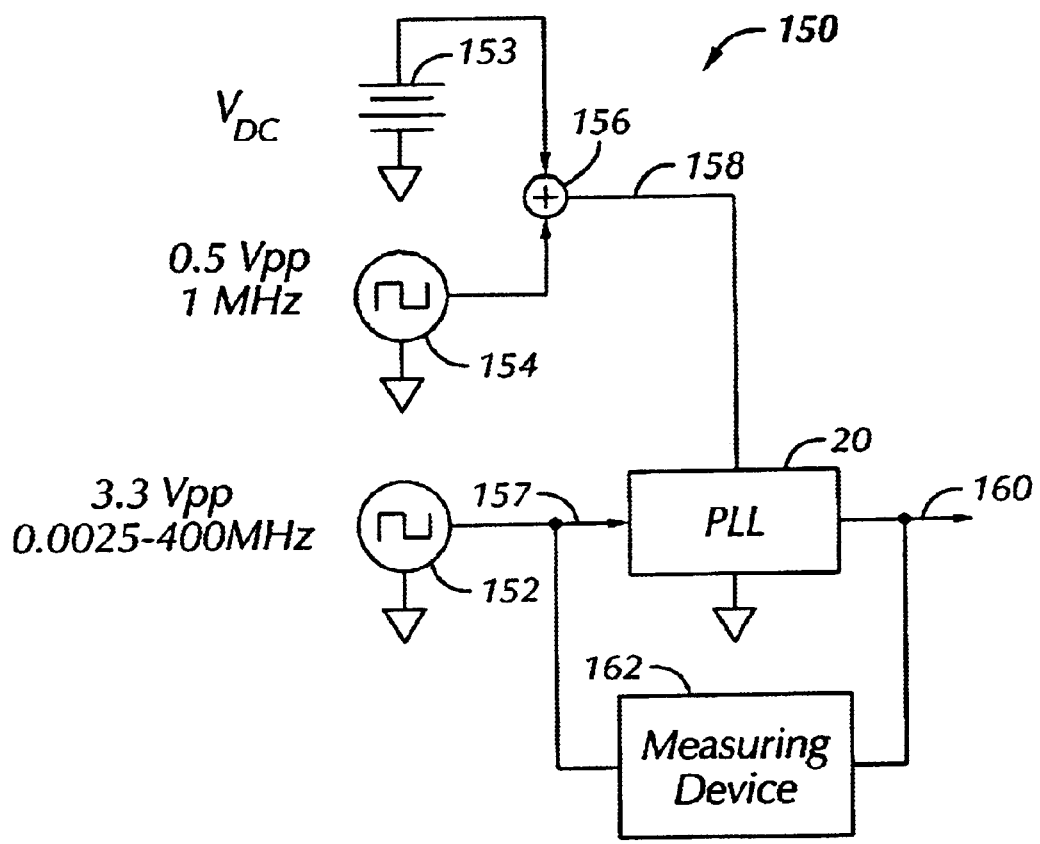
FIG. 4 shows a phase locked loop circuit test arrangement.

In the absence of an accurate model, worst case simulations are often used. In FIG. 4, a test arrangement (150) for a PLL (20) is shown. The PLL (20) is supplied by a DC power supply (153). The PLL (20) has, in this example, a clock input (152) comprising a square wave between 0 V and 3.3 V at a frequency that can be varied between 2.5 kHz and 400 MHz on signal line (157). The PLL output (160) has a frequency that is the same or a multiple of the clock input (152). A measuring device (162) measures the variations between the clock input (152) and the PLL output (160). Ideally, the PLL output (160) should be a multiple of N times the clock input (152); however, due to power supply noise, variations, or jitter, in the transition time from one state to another of the PLL output (160) occur. To model the power supply noise, a square wave generator (154) supplies a 0.5 V peak-to-peak signal that is added to the DC power supply (153) at adder (156). The combined DC power supply (153) and square wave generator (154) output is supplied on power supply line (158) to the PLL (20). The power supply waveform having noise on power supply line (158) creates jitter on the PLL output (160). Temporal shifts and rate of occurrence of the temporal shifts between the clock input (152) and the PLL output (160) are measured by the measuring device (162). The voltage of the DC power supply (153), and frequencies and amplitude of the square wave generator (154) and clock input (152) may be changed to model different operating points.

Because the noise generated by the square wave generator (154) typically exceeds power supply noise, the jitter on the PLL output (160) may not be representative of actual noise. Reducing the loop bandwidth by adding additional components to filter this degree of jitter may be unnecessary.

Figure 5A:
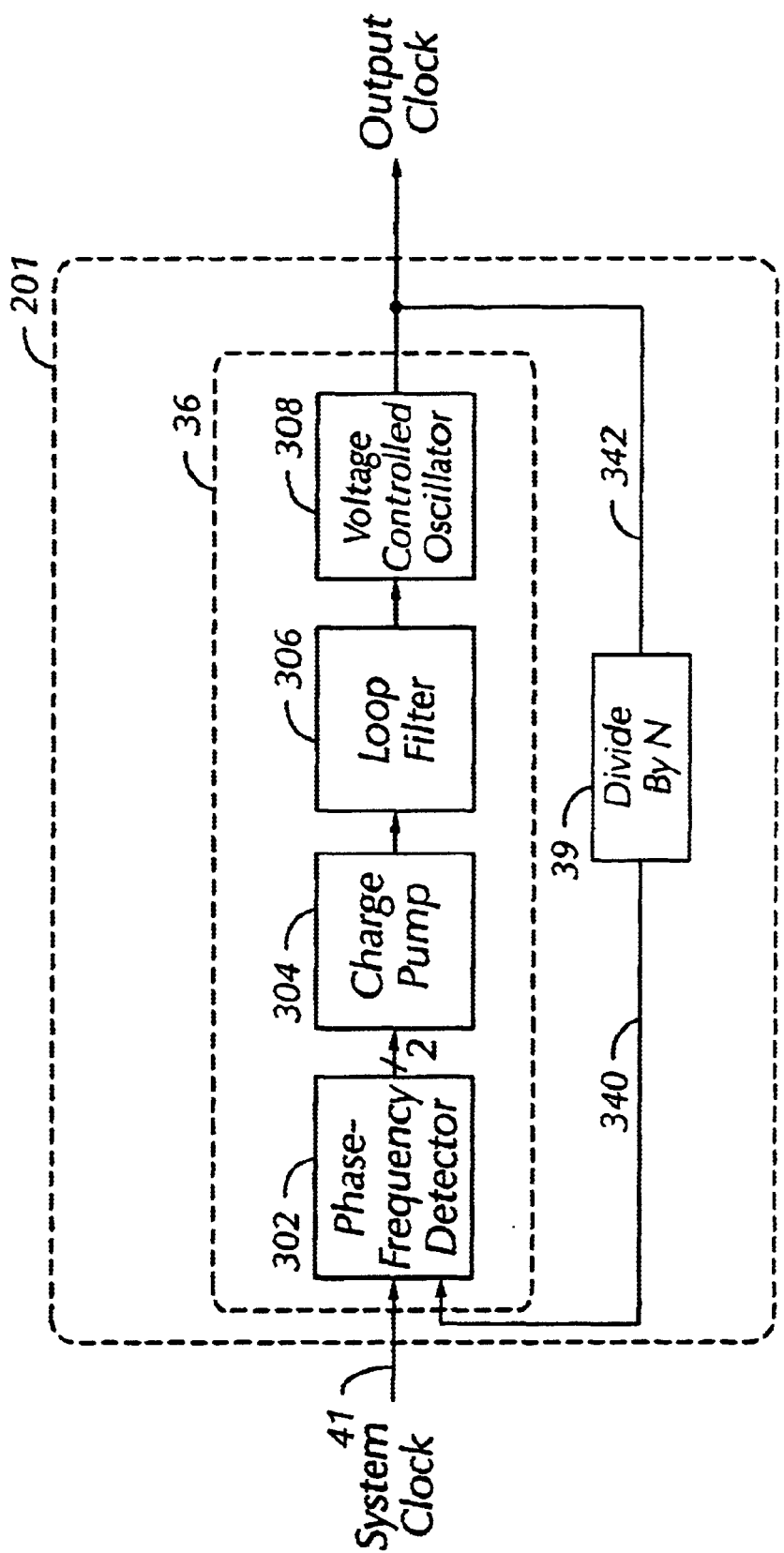
FIG. 5a shows a phase locked loop circuit diagram.

In FIG. 5a shows a typical PLL block diagram. The PLL (201) has an input of system clock (41) that is used to create a phased output, output clock (342). The basic elements of the PLL core (36) are a phase-frequency detector (302), charge pump (304), loop filter (306), and voltage-controlled oscillator (308). Output clock (342) may have a higher frequency than the system clock (41). A divide by N circuit (39) is used to reduce the frequency of the output clock (342) so that the system clock (41) and divided output clock (340) can be input to the phase-frequency detector (302). The phase-frequency detector (302) measures the phase and frequency difference between system clock (41) and divided output clock (340). The phase-frequency detector (302) produces signals that control a charge pump (304), typically up or down pulses (not shown), to increase or decease the net charge at the output of the charge pump (304). The charge pump (304) adds or removes charge from the loop filter (306). The loop filter (306) may be composed of a resistor and capacitor in series that are connected to ground. The charge pump (304) adjusts the voltage stored on the capacitor in the loop filter (306). The voltage-controlled oscillator (308) produces the output clock (342) that has a frequency proportional to the voltage input to the voltage-controlled oscillator (308). Because the voltage input to the voltage-controlled oscillator (308) may be susceptible to power supply noise, the output clock (342) may jitter. The amount of capacitance in the loop filter (306) helps determine how much of the power supply noise affects the voltage-controlled oscillator (308).

Figure 5B:
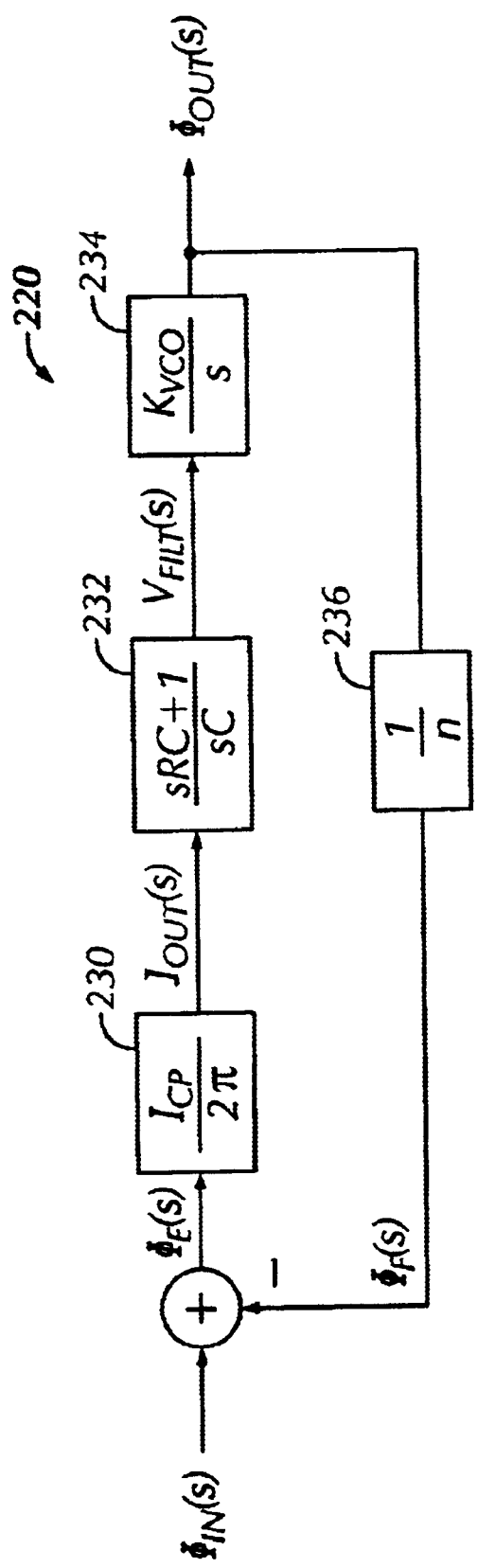
FIG. 5b shows a phase locked loop control diagram.

In FIG. 5b, the frequency response of the PLL (220) may be analyzed with a Laplace transform approximation, where the sample operation of the phase-frequency detector is ignored. This approximation is useful for loop bandwidths about a decade or more below the operating frequency of the PLL. This loop bandwidth constraint is also required for stability due to the reduced phase margin near the higher order poles that result from the delay around the sampled feedback loop. The modeled charge pump (230) adds or removes charge to its output depending on the state of input control signals, typically up or down pulses (not shown). Both pulses may be 'on' at the same time, however, if the up or the down pulse remains 'on' longer than the other, the net charge at the output of the charge pump (230) increases or decreases. The charge pump gain may be modeled as a linear gain versus phase error where $I_{OUT}(s)/\Phi_E(s)=I_{CP}/2\pi$. The loop filter (232) may be modeled as a series combination of a capacitor, C, and a resistor, R, connected from $I_{OUT}$ to ground. The loop filter (232) transforms the output of the charge pump, $I_{OUT}$, into the voltage-controlled oscillator input voltage, $V_{FILT}$. The Laplace transform of the series resistor and capacitor in the loop filter (232) is $V_{FILT}(s)/I_{OUT}(s)=(sRC+1)/(sC)$. The transfer function of the capacitor and resistor shows that a zero is added that adds stability to the PLL loop. The voltage-controlled oscillator (234) outputs a clock that has a frequency proportional to the input voltage $V_{FILT}$. The Laplace transform of the voltage-controlled oscillator (234) is $\Phi_{OUT}(s)/V_{FILT}(s)=I_{CP}/V_{FILT}(s)=K_{VCO}/s$. The closed-loop transfer function can now be derived as $H(s)=\Phi_{OUT}(s)/\Phi_{IN}(s)=[(R\ K_{VCO}I_{CP}/2\pi)/(s+1/R\ C)]/[s^2+s\ R\ C\ K_{VCO}I_{CP}/2\pi N\ C+K_{VCO}I_{CP}/2\pi N\ C]$. H(s) is a second order system that has one pole from the loop filter (232) and one pole from the voltage-controlled oscillator (234), and one zero from the resistor, R, in the loop filter (232). The transfer function H(s) has a natural frequency $\omega_n=(K_{VCO}I_{CP}/2\pi N\ C)^{0.5}$ and a damping factor $\zeta=R\ C\ \omega_n/2$.

The loop bandwidth is defined as the frequency at which the output magnitude is 3 dB lower than when the input is DC. Loop bandwidth is not the same as natural frequency, although they are often close. Once $\zeta$, $\omega_n$, $K_{VCO}$, and $I_{CP}$ are chosen, the values for R and C can be determined for any selected loop bandwidth. Low loop bandwidth allows the PLL to filter input jitter. High loop bandwidth allows the PLL to follow and compensate for output jitter induced by power supply noise. A design tradeoff must be made in the loop bandwidth of the PLL. The value for C has a large effect on loop bandwidth and natural frequency. Optimizing the PLL loop bandwidth relates to balancing the effect of input jitter with the PLL loop's speed of response to compensate for output jitter induced by power supply noise.

Those skilled in the art will appreciate that capacitance may be added to a wide variety of signal lines. Added capacitance generally increases the filtering of input jitter effect but also decreases the loop bandwidth. It will be appreciated that in FIG. 5a, the loop filter (306) may be replaced with a capacitor and bias generator. In this arrangement, the capacitor maintains the voltage provided by the charge pump (304) to the bias generator. The bias generator may use several control lines to control the voltage-controlled oscillator (308). Each of the control lines from the bias generator to the voltage-controlled oscillator (308) may have capacitors connected from a control line to a potential to reduce the effect of input jitter.

Figure 6A:
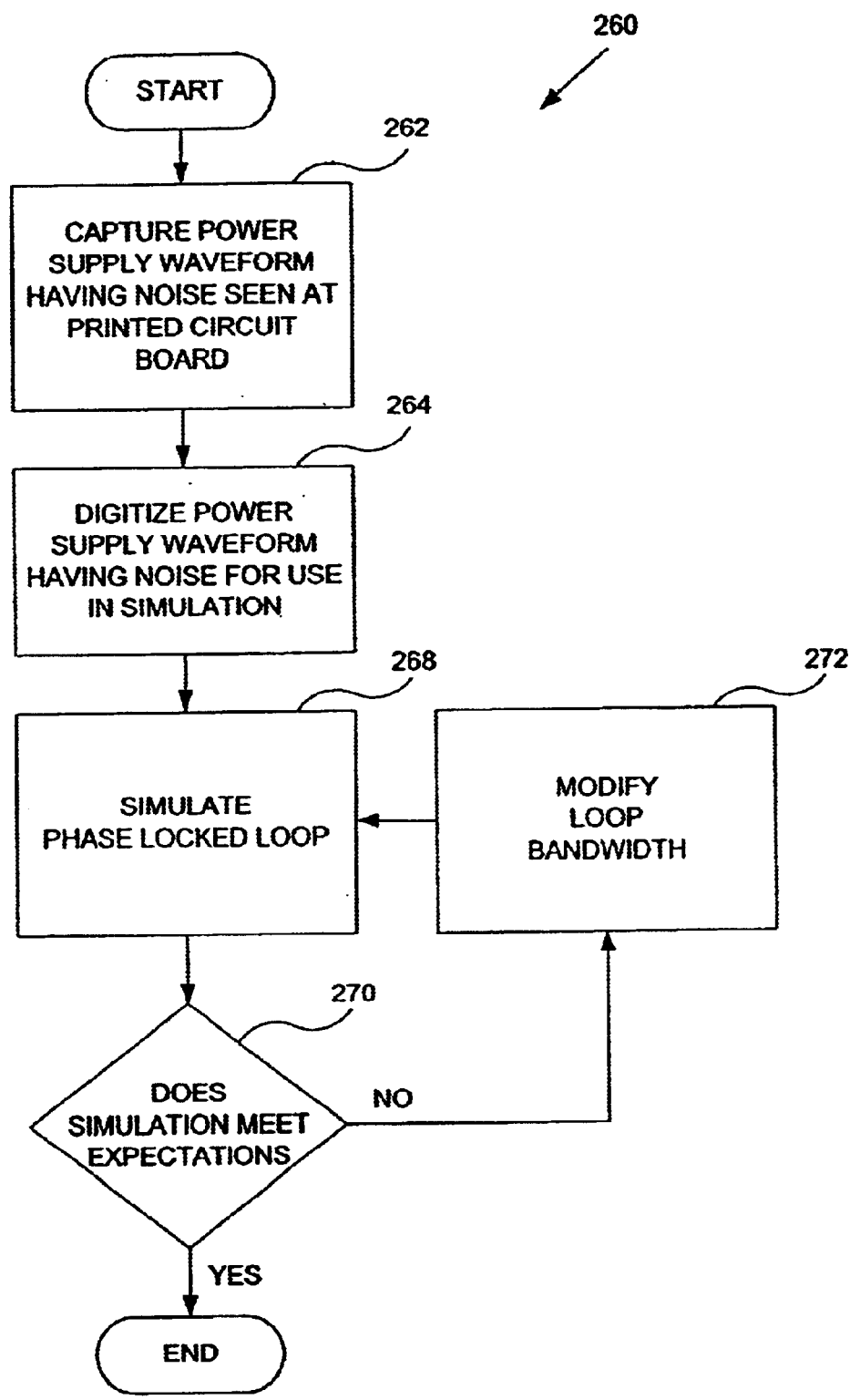
FIG. 6a shows a flow process in accordance with an embodiment of the present invention.

FIG. 6a shows a flow process (260) in accordance with an embodiment of the present invention. At (262), a power supply waveform having noise is captured. A power supply waveform having noise for the purpose of this description may be any power supply that has deviations from a designed voltage. This power supply waveform can be captured at some particular location within a power supply network. Those skilled in the art will appreciate that the noise in the captured power supply waveform comes from a dominant source of noise. A circuit under design does not provide a substantial contribution to the noise in the captured power supply waveform. The power supply waveform having noise may be used to adequately represent a large portion of the power supply network and associated circuitry.

In FIG. 3, for example, circuit C (130) may be the dominant source of noise. The PLL under design may be circuit N (134). By capturing a power supply waveform having noise between impedance networks $Z_2$ (128) and $Z_n$ (132), a system response that represents a large portion of the power supply network and associated circuitry is used. For example, the power supply network and associated circuitry may include the power supply (112), impedance network $Z_1$ (118), circuit A (120), circuit B (126), circuit C (130), and impedance network $Z_2$ (128). Because the dominant source (circuit C (130)) is included in the power supply network and associated circuitry, a simulation using the power supply waveform having noise, impedance network $Z_n$ (132) and circuit N (134) is sufficient.

When simulating a CPU circuit, capturing a power supply waveform on a printed circuit board near the CPU is desirable. The captured power supply waveform will also contain noise as a result of activities on the printed circuit board by one or more circuits. The power supply waveform may be captured by physically measuring the voltage on the printed circuit board under operating conditions with measuring equipment. These operating conditions may include extreme conditions in an effort to capture a worst case power supply waveform having noise. These operating conditions may be the result of varying one or more of the following: temperature, voltage, frequency, and manufacturing process. The captured power supply waveform may also be the result of a simulation of some portion of the power supply network. For the purposes of this description of the invention, a representative power supply waveform comprises an approximation of an actual power supply waveform as occurs in a realistic system. By capturing the power supply waveform at an intermediate point in the power supply network, a division in design responsibilities and expertise is achieved. A power supply network designer may focus on design and simulation of a portion of the power supply network while a circuit designer may capture representative power supply signals at an appropriate location to be used as an input to their circuits.

The captured power supply waveform is digitized at (264) to be input to a simulation program. The digitization may be a direct point by point representation. The digitization may also be a representative model of the waveform that may include a formulated representation in which an equation characterizes the power supply waveform having noise. At (268), the response of the PLL under design is simulated using the digitized power supply waveform having noise that had previously been captured from the printed circuit board at (264). The computational overhead of the simulation at 268 is reduced by using the power supply waveform having noise instead of simulating the power supply waveform using a portion of the power supply network that may contain a large number of elements. Also, the simulation of the PLL response at (268) is more accurate because the digitized power supply waveform having noise is used instead of a pessimistic estimate, such as explained with reference to FIG. 4.

As the results of the simulation are analyzed, a decision is made at (270) as to whether the results meet expectations. At (270), the results of the simulation must meet specifications; however, the designer may have guard band or design goal expectations that improve upon the specification. For example, the amount of jitter may be compared against a specification. If the expectations are not met, (272) is followed to modify the design and/or the loop bandwidth. (268), (270), and (272) are repeated until a satisfactory result occurs. For example, the loop bandwidth may be simulated until it is optimized based on the amount of jitter meeting or improving upon specifications.

Figure 6B:
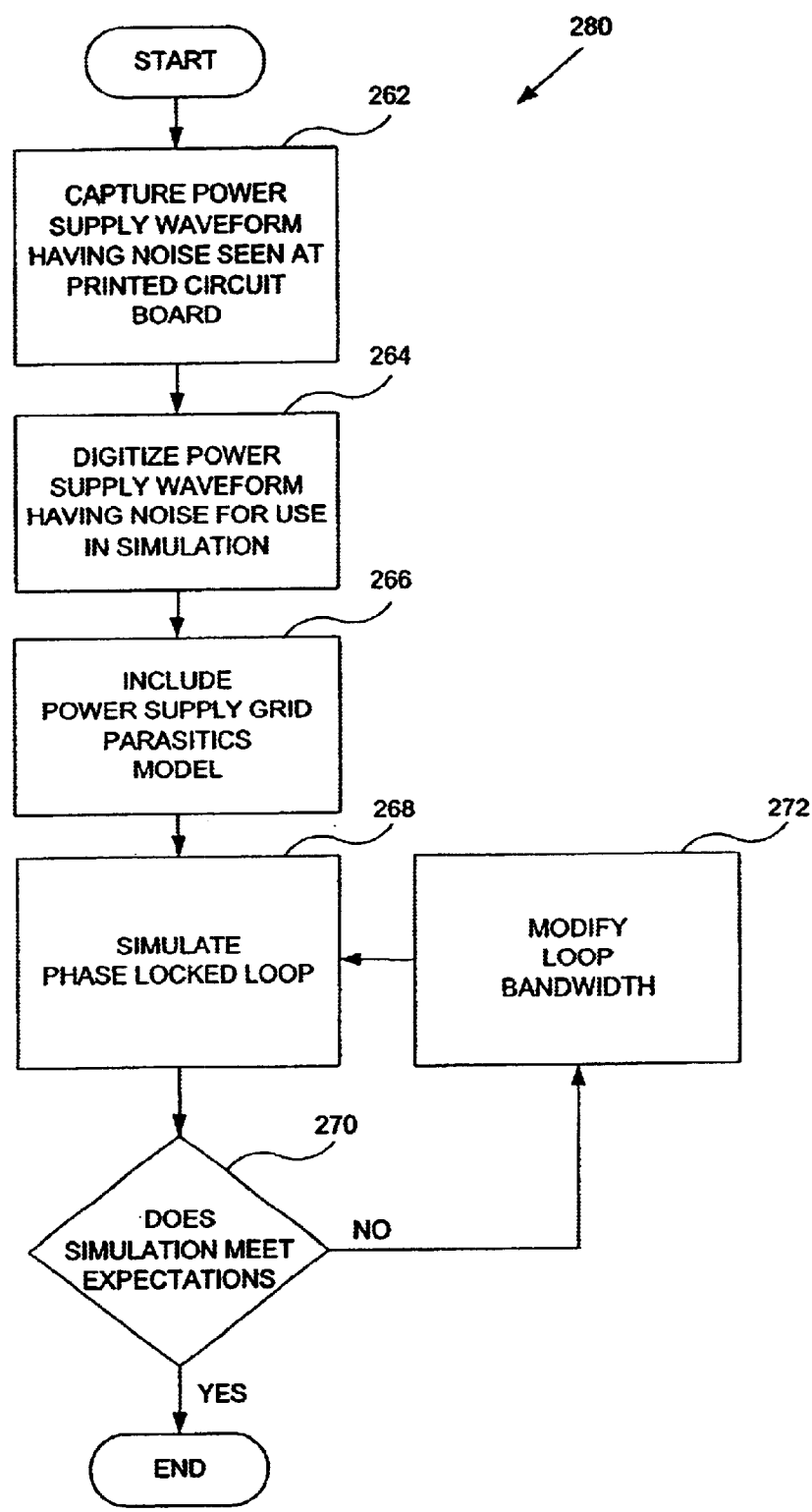
FIG. 6b shows a flow process in accordance with another embodiment of the present invention.

FIG. 6b shows a flow process (280) in accordance with another embodiment of the present invention. At (262), a power supply waveform having noise, as described previously, is captured. The captured power supply waveform is digitized at (264), as described previously, to be input to a simulation program. Capturing and digitizing the power supply waveform does not preclude the addition of circuits to model another portion of the power supply network not represented in the captured and digitized power supply waveform. This additional portion of the power supply network may be used between the captured power supply waveform and the circuit under design. At (266), elements may be added to the simulation to represent additional power supply network components. For example, a captured power supply signal may be captured on a printed circuit board; however, the circuit to be designed resides on an integrated circuit. At (266), the power supply network elements that may be added include, but are not limited to, connections (parasitics) between the printed circuit board and chip package, connections (parasitics) between the chip package and chip, and connections (parasitics) between the chip power supply network and circuit under design. These added elements may improve the modeling of the actual passive parasitics. At (268), the PLL under design is simulated using the digitized power supply waveform having noise captured from the printed circuit board at (264) and the parasitics from (266). At (268), the computational overhead of the simulation is reduced due to the input of the power supply waveform having noise being used instead of a portion of the power supply network that may contain a large number of elements. Also, the simulation of the PLL at (268) is more accurate because the digitized power supply waveform having noise is used instead of a square wave.

As the results of the simulation are analyzed, a decision is made at (270) as to whether the results meet expectations. At (270), the results of the simulation must meet specifications; however, the designer may have guard band or design goal expectations that improve upon the specification. For example, the amount of jitter may be compared against a specification. If the expectations are not met, (272) is followed to modify the design and/or the loop bandwidth. (268), (270), and (272) are repeated until a satisfactory result occurs. For example, the loop bandwidth may be simulated until it is optimized based on the amount of jitter meeting or improving upon specifications.

Those skilled in the art will appreciate that the captured power supply waveform having noise may be obtained from probing a physical system, such as a printed circuit board, chip package, or chip, under various operating conditions. Operating conditions include, but are not limited to, temperature, voltage, frequency, and manufacturing (process) variations. Those skilled in the art will also appreciate that the captured power supply waveform having noise may be obtained from probing an integrated circuit under various operating conditions. Furthermore, those skilled in the art will appreciate that the power supply waveform having noise obtained from a physical system may be obtained from a location adjacent to an intended location of the PLL under various operating conditions. Those skilled in the art will further appreciate that using the power supply waveform having noise in place of a portion of the power supply network reduces the computational load when simulating the circuit.

Those skilled in the art will appreciate that the captured power supply signal having noise may be obtained from simulation data of a modeled printed circuit board's parasitics under various operating conditions. Furthermore, those skilled in the art will appreciate that the captured power supply waveform having noise may be obtained from simulation data of a power supply network's parasitics that may include, but is not limited to, the motherboard power supply network, motherboard to integrated circuit connections, and/or integrated circuit power supply network under various operating conditions. Operating conditions include, but are not limited to, temperature, voltage, frequency, and manufacturing (process) variations. Those skilled in the art will further appreciate that the simulation of the circuit using the power supply waveform having noise may be dependent on various operating conditions. Those skilled in the art will also appreciate that the simulation tool used to simulate the power supply waveform having noise does not have to be the same simulation tool used to simulate the circuit using the power supply waveform having noise.

Those skilled in the art will appreciate that capturing the power supply signal having noise, whether from a physical system or simulation, may advantageously be obtained adjacent to an intended location of the PLL.

Those skilled in the art will appreciate that the noise may be captured separately from the power supply waveform and combined to create the power supply waveform having noise.

Those skilled in the art will appreciate that multiple power supply waveforms having noise may be used simultaneously, and the multiple power supply waveforms having noise may be connected to different locations on the power supply network. Those skilled in the art will further appreciate that the PLL and additional circuits may be used in the simulation at (268).

Those skilled in the art will appreciate that the PLL may be analog, digital, or a combination of both types of circuits.

Figure 7:
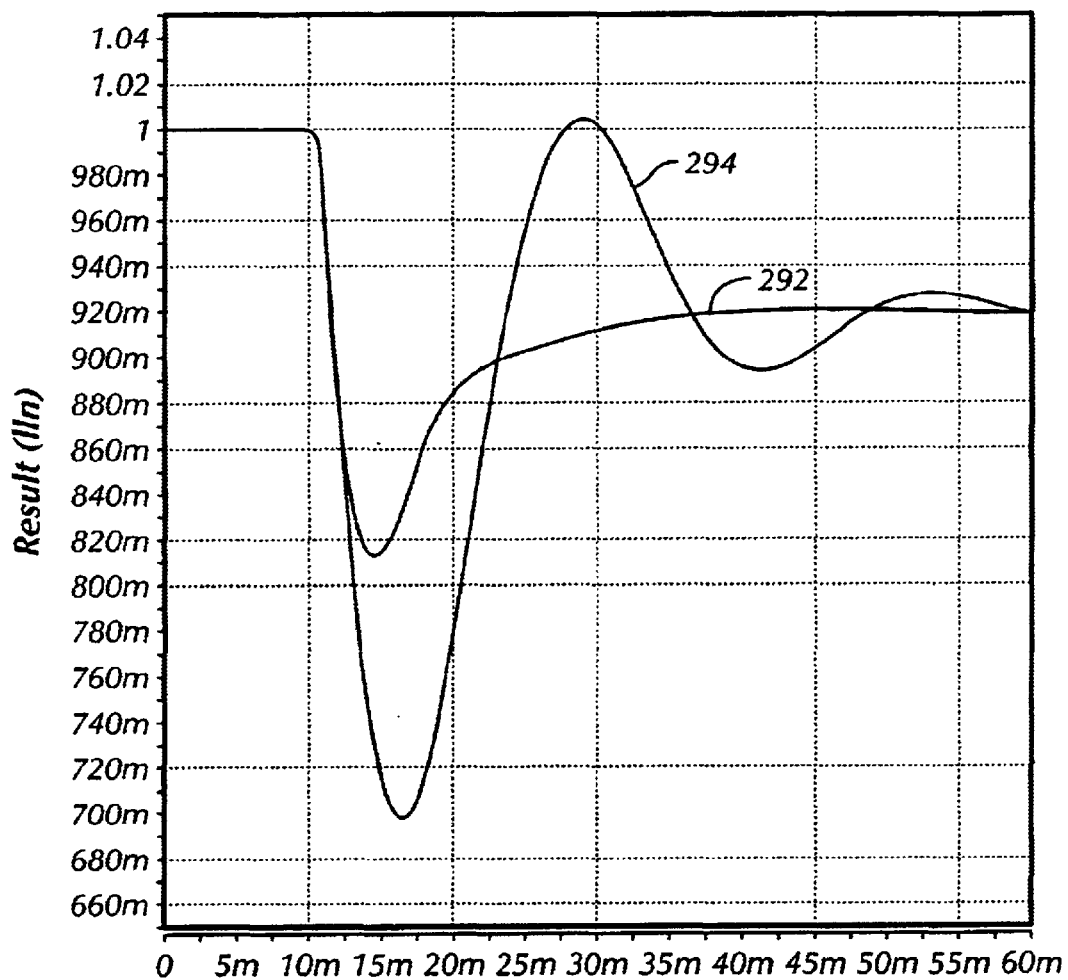
FIG. 7 shows captured power supply waveforms in accordance with another embodiment of the present invention.

In FIG. 7, two captured power supply waveforms having noise (292, 294), in accordance with various embodiments of the present invention, are shown. Both captured power supply waveforms start at time zero at approximately 1 V. At 10 ns, one or more circuits interacting with one or more impedance networks create noise on the power supply waveforms. For power supply waveform (292), the effect is reduced compared to power supply waveform (294). Depending on the needs of a circuit designer, either power supply waveform (292, 294) can be digitized or modeled, and operatively used as the power supply input to the circuit simulation.

Those skilled in the art will appreciate that power supply waveform (292) and power supply waveform (294) may have been captured under different operating conditions. Those skilled in the art will further appreciate that power supply waveform (292) and power supply waveform (294) may have been captured at different locations within the power supply network.

Figure 1:
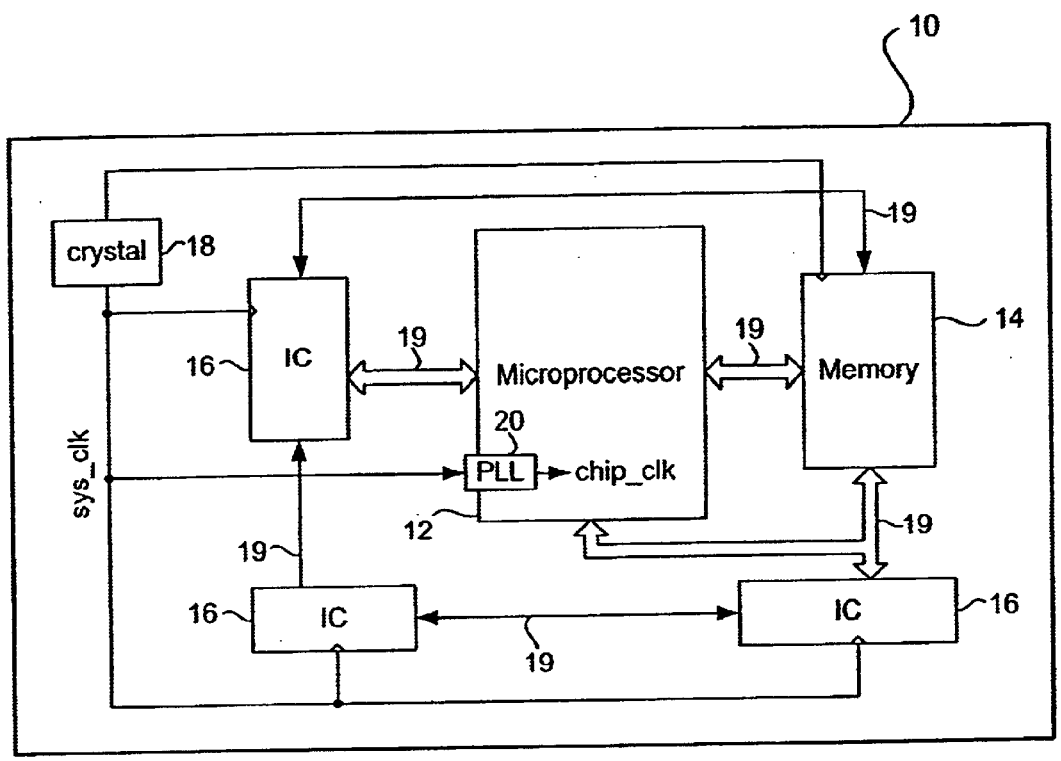
FIG. 1 shows a typical computer system.
Figure 2:
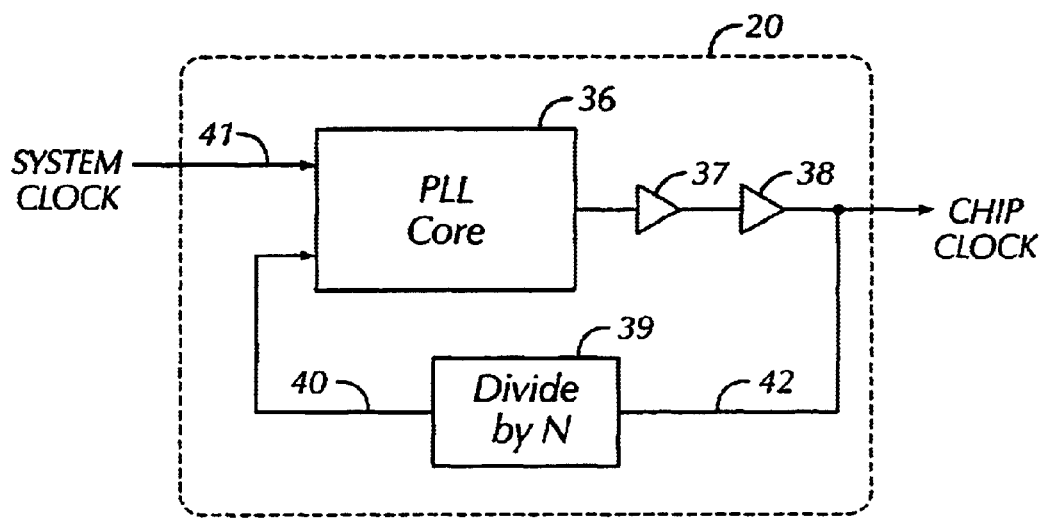
FIG. 2 shows a phase locked loop block diagram.
Figure 8:
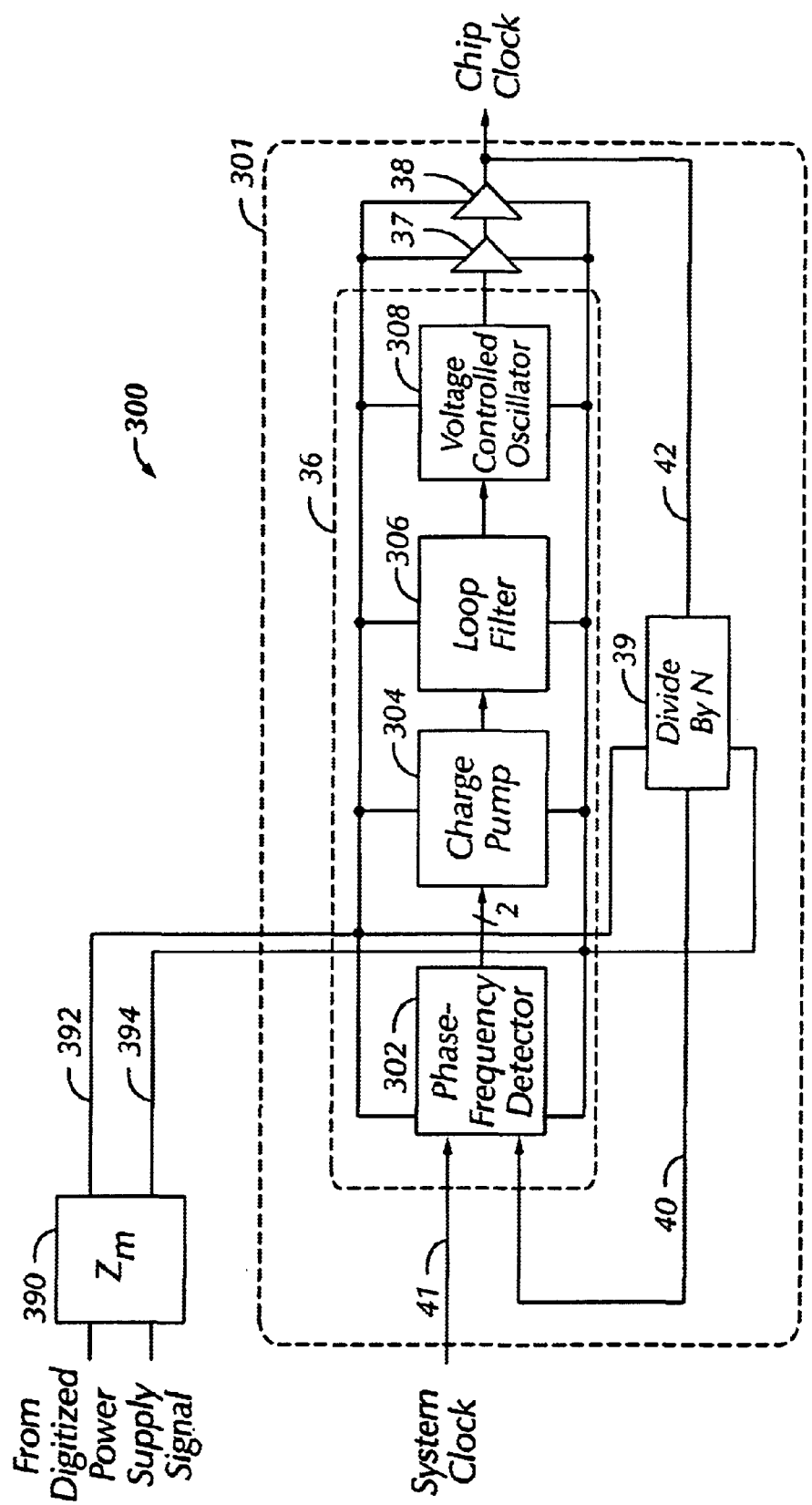
FIG. 8 shows a phase locked loop circuit in accordance with another embodiment of the present invention.

FIG. 8 shows circuit (300) in accordance with an embodiment of the present invention. The PLL (301) has as an input system clock (41) that is used to create a phase shifted output, output clock (42), that is N times the frequency of the system clock (41). The basic elements of the PLL core (36) are a phase-frequency detector (302), charge pump (304), loop filter (306), and voltage-controlled oscillator (308), as described previously. Two additional inverters are added to the output of the voltage-controlled oscillator to buffer the output, as described in FIG. 2. A power supply waveform having noise has been determined from a power supply network and digitized. The power supply waveform having noise is operatively used either through direct digitization or appropriate modeling such as a formulated representation where an equation describes the signal's characteristics. The power supply waveform having noise is input to an impedance network $Z_M$ (390). The impedance network $Z_M$ (390) supplies power to the PLL (301) through power supply line (392) and ground line (394). Simulating the PLL (301) with the representation of the power supply waveform having noise provides a technique to estimate jitter.

Jitter represents the perturbations that result in the intermittent shortening or lengthening of signal elements. For example, a steady clock input may be used as an input of system clock (41) to the PLL (301). A piece-wise linear representation of the power supply waveform having noise, for example power supply waveform having noise ((292) (in FIG. 7)), may be used to supply the impedance network $Z_M$ (390). The power supply waveform having noise (292) may be acquired from a simulation of a printed circuit board. The impedance network $Z_M$ (390) represents additional impedances between the printed circuit board and the PLL (301) that is located on an integrated circuit. The power supply waveform having noise may disturb the chip clock (42) from the inverters (37, 38) driven by the voltage-controlled oscillator (308). Timing variations between the transition from one state to another state of the chip clock (42) represent jitter. Optimization of the loop bandwidth may be based on jitter using the power supply waveform having noise. Because a realistic power supply waveform having noise is used, the PLL will not be over designed with respect to loop bandwidth. Also, the simulation can be completed in a reasonable amount of time; therefore, the PLL design and/or the loop bandwidth elements may be modified in an iterative fashion to improve the system's performance.

Those skilled in the art will appreciate that a computer system is described for determining a representation of a power supply waveform having noise, using that representation to simulate a phase locked loop, and estimating jitter in the phase locked loop to optimize loop bandwidth.

Those skilled in the art will appreciate that a computer-readable medium having recorded thereon instructions executable by a processor is described to determine a representation of a power supply waveform having noise, using that representation to simulate a phase locked loop, and estimating jitter in the phase locked loop to optimize loop bandwidth.

Advantages of the present invention may include one or more of the following. In some embodiments, because a representation of a power supply signal having noise is used, a more accurate circuit simulation may be performed. Realistic results help alleviate costly over design. A circuit designed with more accurate power supply waveforms may require a reduced amount of chip area. The space saved due to the reduced chip area may be used for additional performance enhancing circuits, or may be used to reduce the final chip size, hence cost.

In some embodiments, because a representation of a power supply signal having noise is used, a circuit simulation that requires less computational load may be performed. Accordingly, more iterations in the design process may be afforded.

In some embodiments, because a representation of a power supply signal having noise is used, tasks involved with designing a power supply network and individual circuits may be advantageously divided and performed by experts in their respective areas of expertise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for optimizing a loop bandwidth in a phase locked loop, comprising:
   inputting a digitized representative power supply waveform having noise to a simulation of the phase locked loop;
   estimating jitter of the phase locked loop;
   adjusting the loop bandwidth of the phase locked loop; and
   repeating the inputting, estimating, and adjusting until the jitter falls below a selected amount.

2. The method of claim 1, wherein adjusting the loop bandwidth comprises adjusting a loop filter capacitor.

3. The method of claim 1, wherein the representative power supply waveform is obtained from a physical system.

4. The method of claim 3, wherein the physical system comprises a printed circuit board.

5. The method of claim 3, wherein the physical system comprises a chip package.

6. The method of claim 3, wherein the physical system comprises a chip.

7. The method of claim 1, wherein the representative power supply waveform is obtained from a location on a physical system adjacent to an intended location of the phase locked loop.

8. The method of claim 1, wherein the representative power supply waveform is obtained from a power supply simulation.

9. The method of claim 8, wherein the power supply simulation is performed using a first simulation tool and the simulation of the phase locked loop is performed using a second simulation tool.

10. The method of claim 1, wherein the representative power supply waveform comprises a noise waveform combined with a power supply waveform.

11. The method of claim 1, wherein the representative power supply waveform is dependent on at least one selected from the group consisting of temperature, voltage, frequency, and manufacturing process.

12. The method of claim 1, wherein the simulation of the phase locked loop is dependent on at least one selected from the group consisting of temperature, voltage, frequency, and manufacturing process.

13. A computer system for optimizing a loop bandwidth in a phase locked loop, comprising:
   a processor;
   a memory; and
   software instructions stored in the memory adapted to cause the computer system to:

input a digitized representative power supply waveform having noise into a simulation of the phase locked loop;

estimate jitter of the phase locked loop;

adjust the loop bandwidth of the phase locked loop; and repeat the input, estimate, and adjust until the jitter falls below a selected amount.

14. The computer system of claim 13, wherein adjusting the loop bandwidth comprises adjusting a loop filter capacitor.

15. The computer system of claim 13, wherein the representative power supply waveform is from a physical system.

16. The computer system of claim 15, wherein the physical system comprises a printed circuit board.

17. The computer system of claim 15, wherein the physical system comprises a chip package.

18. The computer system of claim 15, wherein the physical system comprises a chip.

19. The computer system of claim 13, wherein the representative power supply waveform is obtained from a location on a physical system adjacent to an intended location of the phase locked loop.

20. The computer system of claim 13, wherein the representative power supply waveform is obtained from a power supply simulation.

21. The computer system of claim 20, wherein the power supply simulation is performed using a first simulation tool and the simulation of the phase locked loop is performed using a second simulation tool.

22. The computer system of claim 13, wherein the representative power supply waveform comprises a noise waveform combined with a power supply waveform.

23. The computer system of claim 13, wherein the representative power supply waveform is dependent on at least one selected from the group consisting of temperature, voltage, frequency, and manufacturing process.

24. The computer system of claim 13, wherein the simulation of the phase locked loop is dependent on at least one selected from the group consisting of temperature, voltage, frequency, and manufacturing process.

25. A computer-readable medium having recorded thereon instructions executable by a processor, the instructions adapted to:

input a digitized representative power supply waveform having noise into a simulation of a phase locked loop;

estimate jitter of the phase locked loop;

adjust the loop bandwidth of the phase locked loop; and repeat the input, estimate, and adjust until the jitter falls below a selected amount.

26. The computer-readable medium of claim 25, wherein adjusting the loop bandwidth comprises adjusting a loop filter capacitor.

27. The computer-readable medium of claim 25, wherein the representative power supply waveform is determined from a physical system.

28. The computer-readable medium of claim 27, wherein the physical system comprises a printed circuit board.

29. The computer-readable medium of claim 27, wherein the physical system comprises a chip package.

30. The computer-readable medium of claim 27, wherein the physical system comprises a chip.

31. The computer-readable medium of claim 25, wherein the representative power supply waveform is obtained from a location on a physical system adjacent to an intended location of the phase locked loop.

32. The computer-readable medium of claim 25, wherein the representative power supply waveform is obtained from a power supply simulation.

33. The computer-readable medium of claim 32, wherein the power supply simulation is performed using a first simulation tool and the simulation of the phase locked loop is performed using a second simulation tool.

34. The computer-readable medium of claim 25, wherein the representative power supply waveform comprises a noise waveform combined with a power supply waveform.

35. The computer-readable medium of claim 25, wherein the representative power supply waveform is dependent on at least one selected from the group consisting of temperature, voltage, frequency, and manufacturing process.

36. The computer-readable medium of claim 25, wherein the simulation of the phase locked loop is dependent on at least one selected from the group consisting of temperature, voltage, frequency, and manufacturing process.

* * * * *